(12) United States Patent
Sung

(10) Patent No.: US 10,971,452 B2
(45) Date of Patent: Apr. 6, 2021

(54) SEMICONDUCTOR PACKAGE INCLUDING ELECTROMAGNETIC INTERFERENCE SHIELDING LAYER

(71) Applicant: SK hynix Inc., Icheon-si Gyeonggi-do (KR)

(72) Inventor: Ki-Jun Sung, Cheongju-si Chungcheongbuk-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 16/773,490

(22) Filed: Jan. 27, 2020

(65) Prior Publication Data

US 2021/0074641 A1    Mar. 11, 2021

(30) Foreign Application Priority Data

Sep. 6, 2019    (KR) .................. 10-2019-0110615

(51) Int. Cl.
| | |
|---|---|
| *H01L 23/538* | (2006.01) |
| *H01L 23/31* | (2006.01) |
| *H01L 23/528* | (2006.01) |

(52) U.S. Cl.
CPC ...... *H01L 23/5381* (2013.01); *H01L 23/3121* (2013.01); *H01L 23/3135* (2013.01); *H01L 23/5286* (2013.01); *H01L 23/5386* (2013.01)

(58) Field of Classification Search
None
See application file for complete search history.

(56) References Cited

U.S. PATENT DOCUMENTS

| | | | | |
|---|---|---|---|---|
| 4,607,968 A | * | 8/1986 | Carena .................... | B41J 13/16 400/637 |
| 5,371,654 A | * | 12/1994 | Beaman ............. | G01R 1/07307 174/16.3 |
| 5,426,563 A | * | 6/1995 | Moresco ............... | H01L 21/486 257/E23.065 |

(Continued)

FOREIGN PATENT DOCUMENTS

KR    1020200024499 A    3/2020

*Primary Examiner* — David E Graybill
(74) *Attorney, Agent, or Firm* — William Park & Associates Ltd.

(57) ABSTRACT

A semiconductor package includes a base substrate and first to $N^{th}$ sub packages sequentially stacked over the base substrate with each sub package including a semiconductor die and a bridge die disposed on at least one side of the semiconductor die and electrically connected to the semiconductor die, where N is a natural number equal to or more than two (2). The semiconductor package also includes a molding layer formed on the base substrate and exposing an $N^{th}$ conductive post included in the $N^{th}$ sub package while covering the first to $N^{th}$ sub packages. The semiconductor package further includes a shielding layer formed on the molding layer and electrically connected to the $N^{th}$ conductive post.

22 Claims, 8 Drawing Sheets

(56) References Cited

U.S. PATENT DOCUMENTS

| | | | | |
|---|---|---|---|---|
| 5,544,017 | A * | 8/1996 | Beilin | H01L 23/49838 174/255 |
| 5,561,265 | A * | 10/1996 | Livshits | H01L 23/08 174/386 |
| 5,639,989 | A * | 6/1997 | Higgins, III | H05K 3/284 174/386 |
| 6,014,313 | A * | 1/2000 | Hesselbom | H01L 25/0652 174/16.3 |
| 6,027,958 | A * | 2/2000 | Vu | H01L 21/568 257/679 |
| 6,091,138 | A * | 7/2000 | Yu | H01L 25/0652 257/686 |
| 6,486,549 | B1 * | 11/2002 | Chiang | H01L 25/0652 257/687 |
| 7,109,410 | B2 * | 9/2006 | Arnold | H01L 23/04 174/390 |
| 7,498,674 | B2 * | 3/2009 | Meyer-Berg | H01L 24/06 257/723 |
| 7,663,232 | B2 * | 2/2010 | Kinsley | H01L 25/0657 257/726 |
| 7,759,167 | B2 * | 7/2010 | Vanfleteren | H01L 24/82 438/118 |
| 7,799,602 | B2 * | 9/2010 | Pagaila | H01L 21/56 438/106 |
| 8,105,872 | B2 * | 1/2012 | Pagaila | H01L 21/568 438/106 |
| 8,227,904 | B2 * | 7/2012 | Braunisch | H01L 24/73 257/686 |
| 8,263,439 | B2 * | 9/2012 | Marimuthu | H01L 23/49816 438/126 |
| 8,304,877 | B2 * | 11/2012 | Fujii | H01L 23/49816 257/686 |
| 8,415,792 | B2 * | 4/2013 | West | H01L 23/544 257/737 |
| 8,564,137 | B2 * | 10/2013 | Zhang | H01L 25/0657 257/774 |
| 8,680,684 | B2 * | 3/2014 | Haba | H01L 25/0655 257/774 |
| 8,742,576 | B2 * | 6/2014 | Thacker | H01L 24/91 257/738 |
| 9,136,259 | B2 * | 9/2015 | Pratt | H01L 24/12 |
| 9,269,657 | B2 * | 2/2016 | Kim | H01L 23/49811 |
| 9,331,054 | B2 * | 5/2016 | Chang | H01L 25/0657 |
| 9,362,235 | B2 * | 6/2016 | Kim | H01L 25/0657 |
| 9,607,968 | B1 * | 3/2017 | Jeong | H01L 23/3121 |
| 9,613,942 | B2 * | 4/2017 | Lee | H01L 25/0652 |
| 9,685,605 | B2 * | 6/2017 | Otsuka | H01L 27/222 |
| 9,768,037 | B2 * | 9/2017 | Palm | H01L 24/25 |
| 9,768,090 | B2 * | 9/2017 | Liang | H01L 25/105 |
| 9,781,863 | B1 * | 10/2017 | Kim | H01L 23/3677 |
| 9,806,060 | B2 * | 10/2017 | Jeong | H01L 23/562 |
| 9,899,352 | B2 * | 2/2018 | Kim | H01L 25/18 |
| 10,079,220 | B2 * | 9/2018 | Hu | H01L 25/0655 |
| 10,211,190 | B2 * | 2/2019 | Kim | H01L 23/552 |
| 10,217,720 | B2 * | 2/2019 | Wang | H01L 25/50 |
| 10,388,611 | B2 * | 8/2019 | Cho | H01L 23/3128 |
| 10,438,901 | B1 * | 10/2019 | Krefft | H01L 23/552 |
| 10,453,785 | B2 * | 10/2019 | Shim | H01L 24/97 |
| 10,529,666 | B2 * | 1/2020 | Yu | H01L 23/5389 |
| 10,546,817 | B2 * | 1/2020 | Keser | H01L 25/16 |
| 10,658,332 | B2 * | 5/2020 | Sung | H01L 23/49827 |
| 10,777,531 | B2 * | 9/2020 | Chang | H01L 23/49811 |
| 10,811,359 | B2 * | 10/2020 | Sung | H01L 23/49816 |
| 10,903,131 | B2 * | 1/2021 | Sung | H01L 23/49827 |
| 10,903,196 | B2 * | 1/2021 | Sung | H01L 23/49822 |
| 2004/0231872 | A1 * | 11/2004 | Arnold | H01L 23/49838 174/377 |
| 2007/0080442 | A1 * | 4/2007 | Meyer-Berg | H01L 25/0655 257/686 |
| 2007/0134849 | A1 * | 6/2007 | Vanfleteren | H01L 23/5389 438/123 |
| 2007/0210447 | A1 * | 9/2007 | Kinsley | H05K 3/325 257/723 |
| 2009/0014847 | A1 * | 1/2009 | Chen | H01L 23/552 257/659 |
| 2009/0255705 | A1 * | 10/2009 | Pratt | H01L 25/0657 174/98 |
| 2010/0133534 | A1 * | 6/2010 | Do | H01L 21/563 257/48 |
| 2010/0140759 | A1 * | 6/2010 | Pagaila | H01L 21/565 257/660 |
| 2010/0171208 | A1 * | 7/2010 | Fujii | H01L 23/49816 257/686 |
| 2010/0327424 | A1 * | 12/2010 | Braunisch | H01L 23/13 257/692 |
| 2011/0024916 | A1 * | 2/2011 | Marimuthu | H01L 23/3128 257/774 |
| 2011/0298109 | A1 * | 12/2011 | Pagaila | H01L 24/97 257/660 |
| 2012/0032321 | A1 * | 2/2012 | West | H01L 21/02697 257/737 |
| 2012/0112357 | A1 * | 5/2012 | Zhang | H01L 25/0657 257/774 |
| 2013/0175699 | A1 * | 7/2013 | Haba | H01L 24/96 257/774 |
| 2013/0207261 | A1 * | 8/2013 | Thacker | H01L 24/72 257/738 |
| 2014/0151859 | A1 * | 6/2014 | Kim | H01L 25/0657 257/659 |
| 2014/0264812 | A1 * | 9/2014 | Chang | H01L 25/0657 257/686 |
| 2014/0361427 | A1 * | 12/2014 | Kim | H01L 25/105 257/737 |
| 2015/0235915 | A1 * | 8/2015 | Liang | H01L 21/486 361/764 |
| 2015/0332938 | A1 * | 11/2015 | Palm | H01L 21/561 257/723 |
| 2016/0043047 | A1 * | 2/2016 | Shim, II | H01L 21/56 257/773 |
| 2016/0293833 | A1 * | 10/2016 | Otsuka | H01L 27/222 |
| 2016/0358899 | A1 * | 12/2016 | Lee | H01L 23/5389 |
| 2017/0103965 | A1 * | 4/2017 | Kim | H01L 25/18 |
| 2017/0154869 | A1 * | 6/2017 | Jeong | H01L 23/293 |
| 2017/0278830 | A1 * | 9/2017 | Kim | H01L 25/50 |
| 2018/0130771 | A1 * | 5/2018 | Hu | H01L 23/5389 |
| 2018/0151501 | A1 * | 5/2018 | Yu | H01L 25/50 |
| 2018/0197824 | A1 * | 7/2018 | Xiao | H01L 21/78 |
| 2018/0261550 | A1 * | 9/2018 | Cho | H01L 23/552 |
| 2018/0366436 | A1 * | 12/2018 | Wang | H01L 25/16 |
| 2019/0206799 | A1 * | 7/2019 | Keser | H01L 21/6836 |
| 2019/0333834 | A1 * | 10/2019 | Sung | H01L 23/5383 |
| 2020/0075542 | A1 * | 3/2020 | Sung | H01L 23/5389 |
| 2020/0091123 | A1 * | 3/2020 | Sung | H01L 23/49833 |
| 2020/0091128 | A1 * | 3/2020 | Elsherbini | H01L 23/66 |
| 2020/0176384 | A1 * | 6/2020 | Wu | H01L 23/5381 |
| 2020/0176385 | A1 * | 6/2020 | Sung | H01L 24/24 |
| 2020/0212006 | A1 * | 7/2020 | Chang | H01L 24/18 |
| 2020/0243448 | A1 * | 7/2020 | Qian | H01L 24/24 |
| 2021/0020574 | A1 * | 1/2021 | Yu | H01L 23/5381 |

* cited by examiner

SEMICONDUCTOR PACKAGE INCLUDING ELECTROMAGNETIC INTERFERENCE SHIELDING LAYER

CROSS-REFERENCE TO RELATED APPLICATION

This application claims priority under 35 U.S.C. § 119 to Korean Patent Application No. 10-2019-0110615 filed on Sep. 6, 2019, which is incorporated herein by reference in its entirety.

BACKGROUND

1. Field

Exemplary embodiments relate to a semiconductor package, and more particularly, to a semiconductor package including an electromagnetic interference shielding layer.

2. Discussion of the Related Art

Electromagnetic interference refers to the phenomenon by which high-frequency noise generated by an electronic circuit or system affects an adjacent circuit or system. In order to suppress and block such electromagnetic interference, the generation of high-frequency noise by a circuit or system may be prevented, or a path through which generated high-frequency noise moves along a space or wire may be shielded.

A semiconductor package employs a structure that connects a shielding layer to a ground terminal of the semiconductor package, in order to block high-frequency noise generated by an internal chip of the semiconductor package. However, a variety of process/structure limits cause various problems. For example, the shielding layer and the ground terminal might not be normally connected to each other, or contact resistance may increase even though the shielding layer and the ground terminal are connected to each other.

SUMMARY

Various embodiments are directed to a semiconductor package which can provide a stack package having a plurality of packages stacked therein in order to achieve high integration, and reduce contact resistance while the stack package and an electromagnetic interference shielding layer are connected.

In an embodiment, a semiconductor package may include a base substrate. The semiconductor package may also include first to $N^{th}$ sub packages sequentially stacked over the base substrate, wherein each of the N sub packages includes a semiconductor die and a bridge die disposed on at least one side of the semiconductor die and electrically connected to the semiconductor die, where N is a natural number equal to or more than two (2). The semiconductor package may further include a molding layer formed on the base substrate, wherein the molding layer covers the first to $N^{th}$ sub packages and leaves an $N^{th}$ conductive post included in the $N^{th}$ sub package exposed. The semiconductor package may additionally include a shielding layer formed on the molding layer, wherein the shielding layer is electrically connected to the exposed $N^{th}$ conductive post. The first to $(N-1)^{th}$ sub packages further include first to $(N-1)^{th}$ pluralities of conductive posts disposed on the first to $(N-1)^{th}$ bridge dies of the first to $(N-1)^{th}$ sub packages, respectively, wherein the first to $(N-1)^{th}$ pluralities of conductive posts electrically connect each of the first to $(N-1)^{th}$ bridge dies, respectively, to the bridge die of the sub package disposed thereon among the second to $N^{th}$ sub packages. The $N^{th}$ conductive post of the $N^{th}$ sub package electrically connects the $N^{th}$ bridge die with the shielding layer and electrically connects with conductive posts among the first to $(N-1)^{th}$ pluralities of conductive posts to provide a ground providing path through the first to $N^{th}$ bridge dies of the first to $N^{th}$ sub packages.

In an embodiment, a semiconductor package may include a base substrate. The semiconductor package may also include first to $N^{th}$ sub packages sequentially stacked over the base substrate, wherein each of the N sub packages includes a semiconductor die and a bridge die disposed on at least one side of the semiconductor die and electrically connected to the semiconductor die through a redistribution layer, where N is a natural number equal to or more than two (2). The semiconductor package may further include a molding layer formed on the base substrate, wherein the molding layer covers the first to $N^{th}$ sub packages and leaves an $N^{th}$ conductive post included in the $N^{th}$ sub package exposed. The semiconductor package may additionally include a shielding layer formed on the molding layer, wherein the shielding layer is electrically connected to the exposed $N^{th}$ conductive post. The first to $(N-1)^{th}$ sub packages further include first to $(N-1)^{th}$ pluralities of conductive posts disposed on the first to $(N-1)^{th}$ bridge dies of the first to $(N-1)^{th}$ sub packages, respectively, wherein the first to $(N-1)^{th}$ pluralities of conductive posts electrically connect each of the first to $(N-1)^{th}$ bridge dies, respectively, to the bridge die of the sub package disposed thereon among the second to $N^{th}$ sub packages. The $N^{th}$ conductive post of the $N^{th}$ sub package electrically connects the $N^{th}$ bridge die with the shielding layer and electrically connects with conductive posts among the first to $(N-1)^{th}$ pluralities of conductive posts to provide a ground providing path through the first to $N^{th}$ bridge dies of the first to $N^{th}$ sub packages.

DETAILED DESCRIPTION

Figure 1:
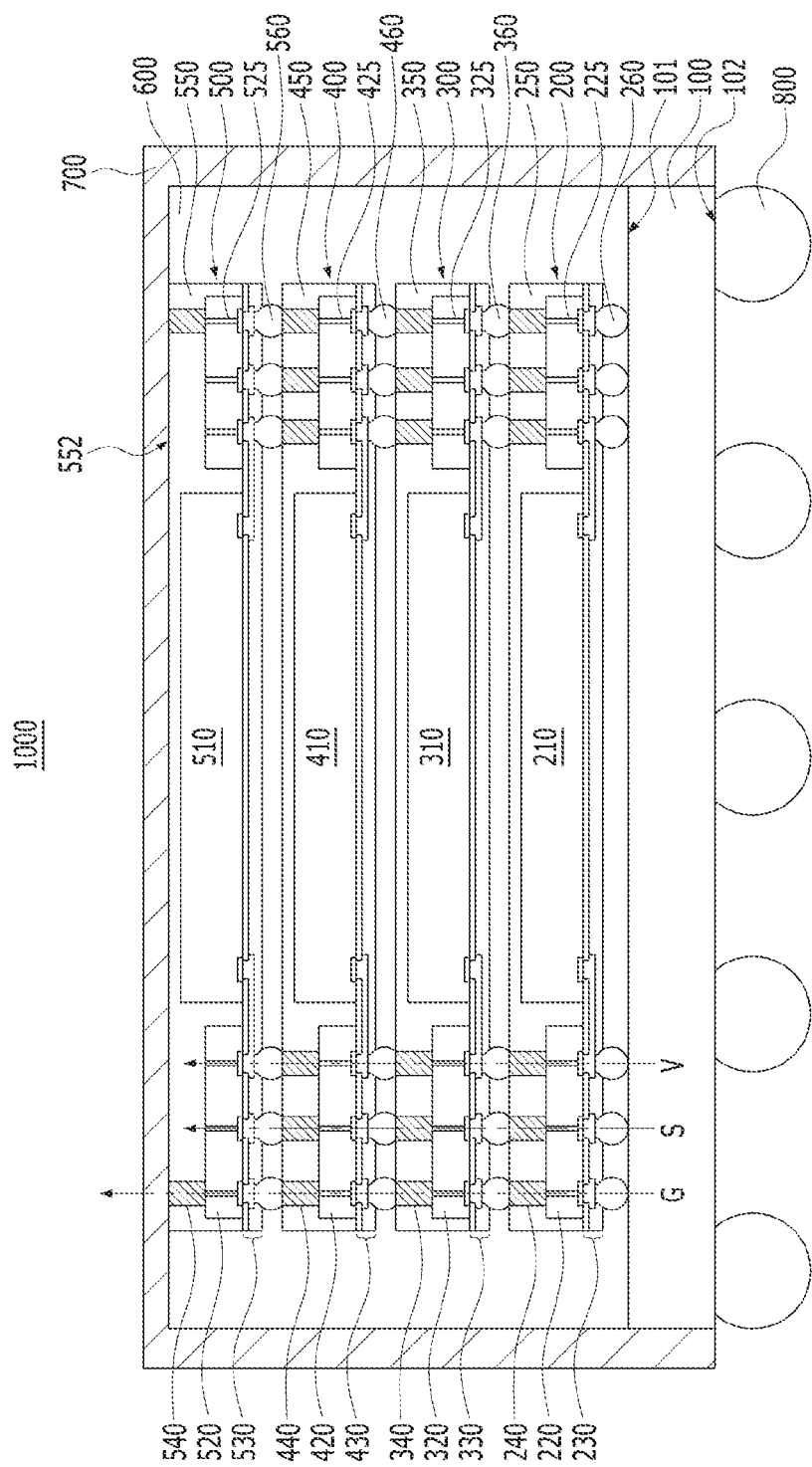
FIG. 1 is a cross-sectional view illustrating a semiconductor package in accordance with an embodiment.

Various examples and implementations of the disclosed technology are described below in detail with reference to the accompanying drawings.

The drawings might not be necessarily to scale and in some instances, proportions of at least some structures shown in the drawings may be exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 2:
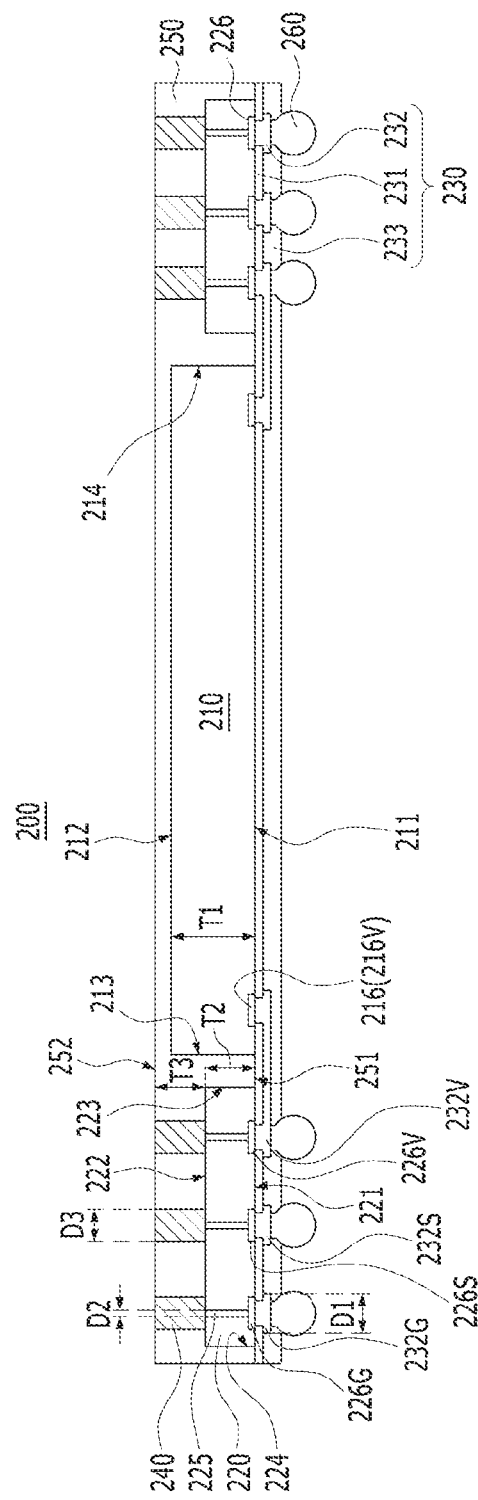
FIG. 2 is an expanded cross-sectional view illustrating a first sub package of FIG. 1.
Figure 3:
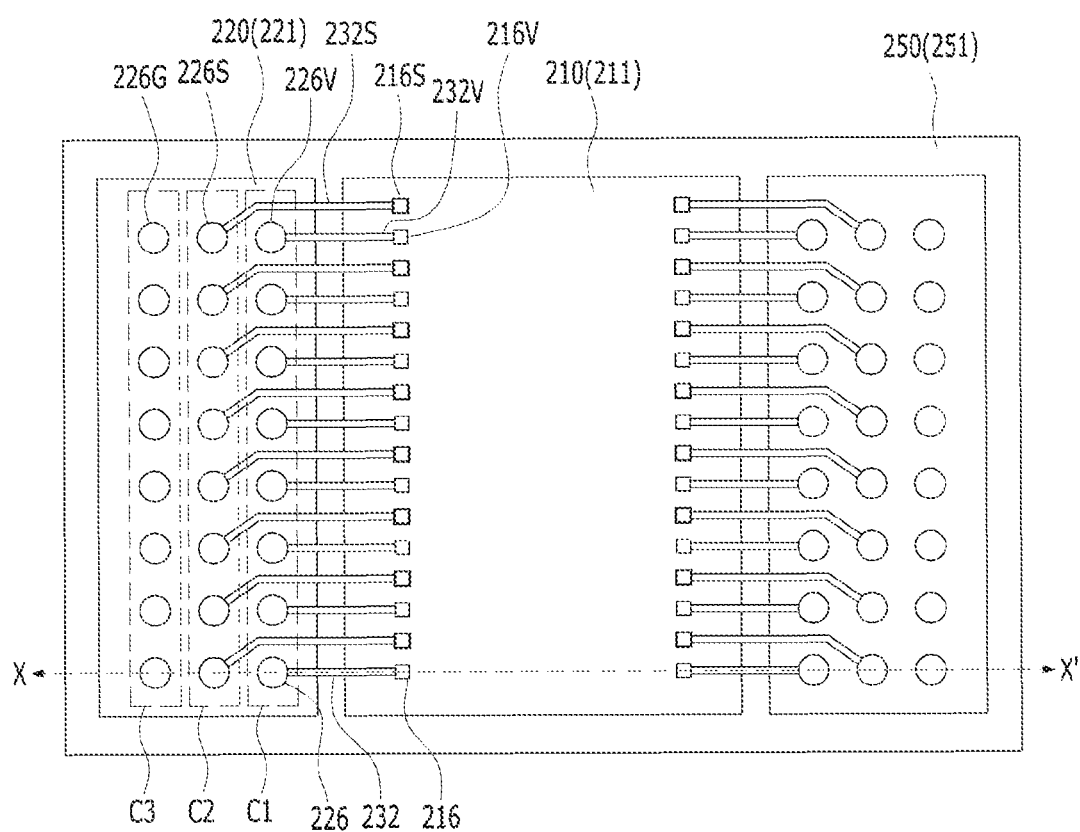
FIG. 3 is a plan view illustrating a surface of the first sub package of FIG. 1 facing a base substrate.
Figure 4:
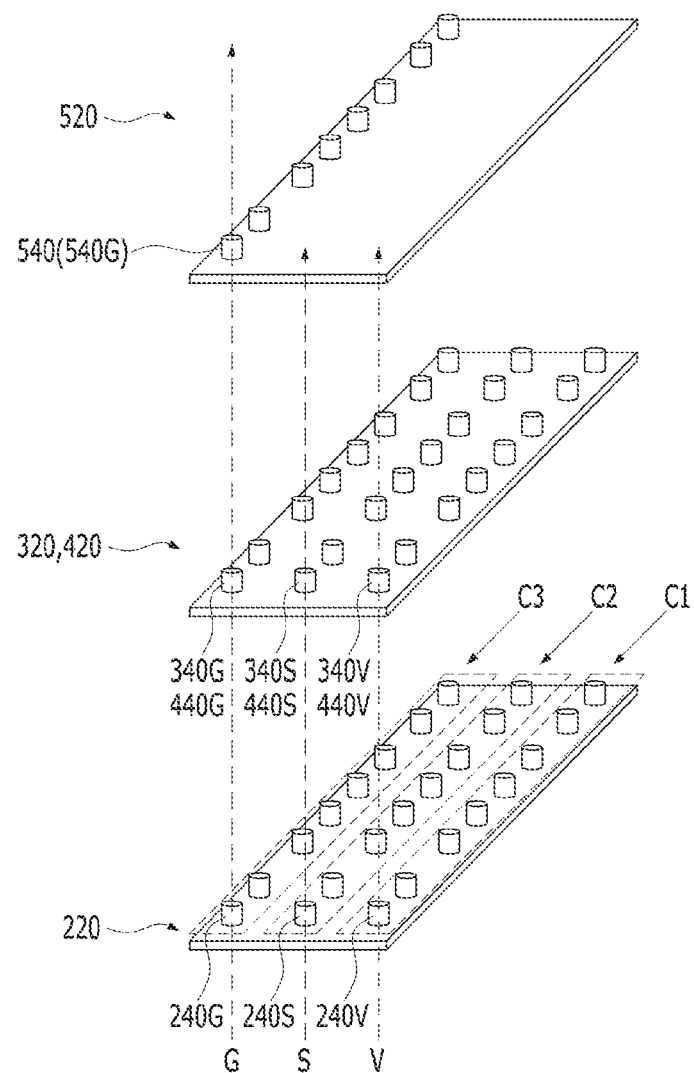
FIG. 4 is a perspective view illustrating a stacked structure of bridge dies of sub packages in FIG. 1, focusing on conductive posts.

FIG. 1 is a cross-sectional view illustrating a semiconductor package 1000 in accordance with an embodiment. FIG. 2 is an expanded cross-sectional view of a first sub package 200 of FIG. 1, taken along a line X-X' of FIG. 3. FIG. 3 is a plan view illustrating a surface of the first sub package 200 facing a base substrate 100. FIG. 4 is a perspective view illustrating a stacked structure of first, second, third, and fourth bridge dies 220, 320, 420, and 520 of first, second, third, and fourth sub packages 200, 300, 400, and 500 in FIG. 1, focusing on conductive posts.

Referring to FIG. 1, the semiconductor package 1000 in accordance with an embodiment may include the base substrate 100, the plurality of sub packages 200, 300, 400, and 500, a molding layer 600, a shielding layer 700, and external connection terminals 800. The plurality of sub packages 200, 300, 400, and 500 may be disposed on a first surface 101 of the base substrate 100 and stacked in a direction perpendicular to a first surface 101 of the base substrate 100. The molding layer 600 is formed on the first surface 101 of the base substrate 100 so as to expose a conductive post 540 included in the uppermost sub package 500 among the plurality of sub packages 200, 300, 400, and 500, while covering the plurality of sub packages 200, 300, 400, and 500. The shielding layer 700 may be formed on the molding layer 600 and connected to the conductive post 540. The external connection terminals 800 may be disposed on a second surface 102 of the base substrate 100, located on the opposite side of the base substrate 100 from the first surface 101, and may connect the semiconductor package 1000 to a component external to the semiconductor package 1000.

The base substrate 100 may include a circuit and/or wiring structure to transfer electrical signals between the plurality of sub packages 200, 300, 400, and 500 and the external connection terminals 800. For example, the base substrate 100 may include a printed circuit board (PCB) or a redistribution layer. Although not illustrated, conductive pads or the like may be disposed on the first and second surfaces 101 and 102 of the base substrate 100, in order to connect the plurality of sub packages 200, 300, 400, and 500 to the external connection terminals 800. FIG. 1 illustrates that the first surface 101 of the base substrate 100 is a top surface, and the second surface 102 is a bottom surface. However, depending on the orientation of the semiconductor package 1000, each of the first and second surfaces 101 and 102 may correspond to the top or bottom surface or either side surface.

The plurality of sub packages 200, 300, 400, and 500 may include four sub packages stacked in a vertical direction, i.e. first, second, third, and fourth sub packages 200, 300, 400, and 500, for example. However, the number of sub packages may be set to various values equal to or more than 2. For convenience of description, the plurality of sub packages are sequentially represented by reference numerals 200, 300, 400, and 500 in ascending order of distance from the base substrate 100.

The first, second, and third sub packages 200, 300, and 400, except the uppermost fourth sub package 500 among the first to fourth sub packages 200, 300, 400, and 500, may have the same structure. The uppermost fourth sub package 500 may have the same structure as the first to third sub packages 200, 300, and 400, except for an arrangement of fourth conductive posts 540.

Hereafter, referring to FIGS. 2 and 3, the first sub package 200 is described in more detail.

Referring to FIG. 2, the first sub package 200 may include a first semiconductor die 210, a first bridge die 220, a first redistribution layer 230, first conductive posts 240, a first sub molding layer 250, and first sub connection terminals 260. The first bridge die 220 may be disposed on at least one side of the first semiconductor die 210; the first redistribution layer 230 may electrically couple the first semiconductor die 210 to the first bridge die 220; the first conductive posts 240 may be formed on the first bridge die 220; the first sub molding layer 250 may cover the first semiconductor die 210, the first bridge die 220, and the first conductive posts 240 over the first redistribution layer 230; and the first sub connection terminals 260 may be formed on the opposite side of the first sub molding layer 250 and electrically coupled to the first redistribution layer 230.

The first semiconductor die 210 may include a first surface 211, a second surface 212, a first side surface 213, and a second side surface 214. The first surface 211 may face the base substrate 100 (see FIG. 1), the second surface 212 may be located on the opposite side of the first semiconductor die 210 from the first surface 211, the first side surface 213 may face the first bridge die 220 on one side of the first semiconductor die 210, for example, the left side, while connecting the first surface 211 and the second surface 212, and the second side surface 214 may face the first bridge die 220 on the other side of the first semiconductor die 210, for example, the right side, while connecting the first surface 211 and the second surface 212.

The first semiconductor die 210 may have first die pads 216 disposed on the first surface 211 thereof. That is, the first die pads 216 may be disposed in a face-down manner. The first die pad 216 may represent an electrical conductive element or terminal which is exposed through the surface of the first semiconductor die 210 in order to connect the first semiconductor die 210 to another component. In an embodiment, the first die pads 216 may be disposed at both edges of the first semiconductor die 210. That is, the first die pads 216 may be disposed in an edge pad type. However, the disposition of the first die pads 216 may be different in different embodiments. For example, the first die pads 216 may be disposed in an edge pad type at only one of both edges of the first semiconductor die 210. Alternatively, the first die pads 216 may be disposed in a center pad type at the central area of the first semiconductor die 210.

The first semiconductor die 210 may be a nonvolatile memory die, such as a NAND flash memory, a phase-change random access memory (PRAM), or a magneto-resistive random access memory (MRAM) or a volatile memory die, such as a dynamic random access memory (DRAM) or a static random access memory (SRAM).

The first bridge die 220 may be disposed on at least one of the first semiconductor die 210 so as to be spaced apart from the first semiconductor die 210. FIG. 2 illustrates that two first bridge dies 220 are positioned on both sides of the first semiconductor die 210, respectively, but any one of the two pictured first bridge dies 220 may be omitted.

The first bridge die 220 may include a first surface 221, a second surface 222, a first side surface 223, and a second side surface 224. The first surface 221 may face the base substrate 100 (see FIG. 1), the second surface 222 may be located on the opposite side of the first surface 221, the first side surface 223 may face the first semiconductor die 210 while connecting the first surface 221 and the second surface 222, and the second side surface 224 may be located on the opposite side of the first side surface 223 while connecting the first surface 221 and the second surface 222. When the first bridge dies 220 are disposed on both sides of the first semiconductor die 210, respectively, as illustrated in the pictured embodiment, the right side surface of the first bridge die 220 on one side of the first semiconductor die 210, for example, the left side, may correspond to the first side surface 223, and the left side surface of the first bridge die 220 on the other side of the first semiconductor die 210, for example, the right side, may correspond to the first side surface 223.

The first surface 221 of the first bridge die 220 may be located at the same level as the first surface 211 of the first semiconductor die 210. On the other hand, because the first bridge die 220 has a smaller thickness T2 than the thickness T1 of the first semiconductor die 210, a level difference between the second surface 222 of the first bridge die 220 and the second surface 212 of the first semiconductor die 210 may correspond to T1-T2.

The first bridge die 220 may include a plurality of first bridge die pads 226 disposed on the first surface 221 and a plurality of first through vias 225 extending from the second surface 222 to the first bridge die pads 226, respectively. The plurality of first through vias 225 and the plurality of first bridge die pads 226 may overlap each other while having a one-to-one correspondence to each other. The first bridge die pad 226 may indicate an electrical conductive element or terminal which is exposed through the surface of the first bridge die 220 in order to connect the first bridge die 220 and/or the first through via 225 to another component. The first through via 225 may have one end connected to the first bridge die pad 226 and the other end exposed through the second surface 222. When the first bridge die 220 includes a semiconductor body such as silicon, the first through via 225 may have a through silicon via (TSV) structure having a relatively small diameter. The first through via 225 may include a metallic material such as copper (Cu) or another conductive material. As described above, because the thickness T2 of the first bridge die 220 is relatively small, the length of the first through via 225 may also be relatively small. Therefore, although the first through via 225 has a small diameter, a required aspect ratio can be satisfied.

The first redistribution layer 230 may be disposed on the first surface 211 of the first semiconductor die 210, the first surface 221 of the first bridge die 220, and a first surface 251 of the first sub molding layer 250, which is located at the same level as the first surfaces 211 and 221, and electrically couple the first semiconductor die 210 and the first bridge die 220. Specifically, the first redistribution layer 230 may include a first redistribution dielectric layer 231, a first redistribution conductive layer 232, and a second redistribution dielectric layer 233. The first redistribution dielectric layer 231 may have openings to expose the first die pad 216 and the first bridge die pad 226, respectively, while covering the first surface 211 of the first semiconductor die 210, the first surface 221 of the first bridge die 220 and the first surface 251 of the first sub molding layer 250. The first redistribution conductive layer 232 may be formed on the first redistribution dielectric layer 231 and fill the openings to connect the first die pad 216 and the first bridge die pad 226 while connected to the first die pad 216 and the first bridge die pad 226. The second redistribution dielectric layer 233 may expose a part of the first redistribution conductive layer 232 while covering the first redistribution dielectric layer 231 and the first redistribution conductive layer 232. The first and second redistribution dielectric layers 231 and 233 may include various dielectric materials, and the first redistribution conductive layer 232 may include a metallic material such as aluminum, copper, or gold.

The arrangement of the first die pad 216, the first bridge die pad 226, and the first redistribution conductive layer 232 are described with reference to FIG. 3.

Referring to FIGS. 2 and 3, the plurality of first die pads 216 may be arranged in a line at either edge of the first surface 211 of the first semiconductor die 210. The first die pads 216 may include first signal pads 216S each configured to receive an input/output signal and first voltage pads 216V each connected to a power supply or ground. In the present embodiment, the first signal pads 216S and the first voltage pads 216V may be alternately arranged along the column direction at either edge of the first semiconductor die 210. However, the positions, numbers, and arrangements of the first signal pads 216S and the first voltage pads 216V may different in different embodiments.

The plurality of first bridge die pads 226 may be arranged in a matrix shape on the first surface 221 of the first bridge die 220. That is, the plurality of first bridge die pads 226 may form rows and columns. The first bridge die pads 226 may include first bridge signal pads 226S to be connected to the first signal pads 216S and first bridge voltage pads 226V to be connected to the first voltage pads 216V. Furthermore, the first bridge die pads 226 may include separate first ground pads 226G which are not connected to the first die pads 216. In the present embodiment, the first bridge voltage pads 226V may be disposed in a line so as to be located the closest to the first semiconductor die 210 (see C1), the first ground pads 226G may be disposed in a line so as to be located the farthest from the first semiconductor die 210 (see C3), and the first bridge signal pads 226S may be disposed in a line between the column C1 of the first bridge voltage pads 226V and the column C3 of the first ground pads 226G (see C2). However, the positions, numbers, and arrangements of the first bridge voltage pads 226V, the first bridge signal pads 226S, and the first ground pads 226G may be different in different embodiments.

The first redistribution conductive layer 232 may include a first signal redistribution conductive layer 232S connecting the first signal pad 216S and the first bridge signal pad 226S to each other and a first voltage redistribution conductive layer 232V connecting the first voltage pad 216V and the first bridge voltage pad 226V to each other.

The first signal redistribution conductive layer 232S may include both ends contacted with the first signal pad 216S and the first bridge signal pad 226S, respectively, and a connection line between the ends. FIG. 3 illustrates only the connection line of the first signal redistribution conductive layer 232S, and the connection line may be extended over the first surface 211 of the first semiconductor die 210, the first surface 251 of the first sub molding layer 250, and the first surface 221 of the first bridge die 220 from the first signal pad 216S to the first bridge signal pad 226S. Both ends of the first signal redistribution conductive layer 232S may overlap openings of the first redistribution dielectric layer 231 so as to fill the openings, and have a larger plan area than the openings. Both ends of the first signal redistribution conductive layer 232S may have the same or similar plan shape as or to the first signal pad 216S and the first bridge signal pad 226S while overlapping the first signal pad 216S and the first bridge signal pad 226S, respectively.

The first voltage redistribution conductive layer 232V may include both ends overlapping the first voltage pad 216V and the first bridge voltage pad 226V, respectively, and a connection line between the ends. FIG. 3 illustrates only the connection line of the first voltage redistribution conductive layer 232V. Both ends of the first voltage redistribution conductive layer 232V may overlap openings of the first redistribution dielectric layer 231 so as to fill the openings, and have a larger plan area than the openings. Both ends of the first voltage redistribution conductive layer 232V may have the same or similar plan shape as or to the first voltage pad 216V and the first bridge voltage pad 226V, while overlapping the first voltage pad 216V and the first bridge voltage pad 226V, respectively.

The first redistribution conductive layer 232 may include a first ground redistribution conductive layer 232G connected to each of the first ground pads 226G. FIG. 3 does not illustrate the first ground redistribution conductive layer 232G, but the first ground redistribution conductive layer 232G may have the same or similar plan shape as or to the first ground pad 226G, while overlapping the first ground pad 226G.

In the present embodiment, because the column C1 of the first bridge voltage pads 226V is the closest to the first semiconductor die 210, the first voltage redistribution conductive layer 232V may have a straight line shape that connects the first voltage pad 216V to the corresponding first bridge voltage pad 226V. On the other hand, because the column C2 of the first bridge signal pads 226S is formed farther from the first semiconductor die 210 than the column C1 of the first bridge voltage pads 226V, the first signal redistribution conductive layer 232S may have a curved or cornered line shape that connects the first signal pad 216S to the corresponding first bridge signal pad 226S while avoiding the first bridge voltage pad 226V. However, as long as the first voltage redistribution conductive layer 232V connects the first voltage pad 216V to the corresponding first bridge voltage pad 226V and the first signal redistribution conductive layer 232S connects the first signal pad 216S to the corresponding first bridge signal pad 226S, the plan shapes of the first voltage redistribution conductive layer 232V and the first signal redistribution conductive layer 232S may be different in different embodiments.

In the present embodiment, the number and arrangement of the first die pads 216 may be set to the same number and arrangement at either edge of the first surface 211 of the first semiconductor die 210. Thus, the first bridge die pads 226 of the first bridge die 220 disposed on one side of the first semiconductor die 210 and the first redistribution conductive layers 232 connected to the first bridge die pads 226 may have a symmetrical structure with the first bridge die pads 226 of the first bridge die 220 disposed on the other side of the first semiconductor die 210 and the first redistribution conductive layers 232 connected to the first bridge die pads 226.

As in the present embodiment, when the first signal pads 216S and the first voltage pads 216V which are arranged in a line in the first semiconductor die 210 are connected to the first bridge signal pads 226S and the first bridge voltage pads 226V which are arranged in different columns in the first bridge die 220, respectively, a space between the first bridge die pads 226 can be secured. When the space between the first bridge die pads 226 can be secured, it may indicate that the plan area or diameter D1 of the first bridge die pad 226 can be increased, and a space between the first through vias 225 can be secured. When the first bridge die pad 226 has a large diameter D1, the first bridge die pad 226 may be more readily connected to the first through via 225 and/or the first redistribution conductive layer 232. Furthermore, when the first through vias 225 have a large space therebetween, the plan area or diameter D3 of the first conductive post 240 can be increased as is described below. For reference, although not illustrated in FIG. 3, the first through vias 225 may be arranged in a matrix shape at positions overlapping the respective first bridge die pads 226, because the first through vias 225 are connected to the respective first bridge die pads 226. However, the diameter D2 of the first through via 225 may be smaller than the diameter D1 of the first bridge die pad 226.

Referring back to FIG. 2, the plurality of first conductive posts 240 may be arranged on the second surface 222 of the first bridge die 220 so as to be connected to the other ends of the plurality of first through vias 225, respectively. The first through vias 225 and the first conductive posts 240 may overlap each other while having a one-to-one correspondence to each other.

The first conductive post 240 may be formed of a metallic material such as copper (Cu) or another conductive material, while having a pillar shape. The first conductive post 240 may have one end connected to the first through via 225 and the other end located on the opposite side of the one end and exposed through a second surface 252 of the first sub molding layer 250.

The first conductive post 240 may serve to electrically extend the first through via 225 to the second surface 252 of the first sub molding layer 250. For this structure, the distance from the first surface 221 of the first bridge die 220 to the other end of the first conductive post 240 may be equal to or larger than the first thickness T1 of the first semiconductor die 210. In other words, the sum of the thickness T2 of the first bridge die 220 and the thickness T3 of the first conductive post 240 may be equal to or more than the thickness T1 of the first semiconductor die 210. Furthermore, because the first through vias 225 have a large space therebetween as described above, it is possible to increase the diameter D3 of the conductive post 240. The diameter D3 of the conductive post 240 may be larger than the diameter D2 of the first through via 225, and equal or similar to the diameter D1 of the first bridge die pad 226.

Because the first conductive posts 240 are connected to the first through vias 225, respectively, the first conductive posts 240 may also be arranged in a matrix shape at positions overlapping the respective first bridge die pads 226 illustrated in FIG. 3.

The first sub molding layer 250 may be formed on the surface of the first redistribution layer 230, on which the first semiconductor die 210 and the first bridge die 220 are formed, so as to cover the first semiconductor die 210 and the first bridge die 220 while exposing the other ends of the first conductive posts 240, for example, the upper ends. For example, the second surface 252 of the first sub molding layer 250 may be located at the same level as the other end of the first conductive post 240. Furthermore, when the thickness T1 of the first semiconductor die 210 is equal to the sum of the thickness T2 of the first bridge die 220 and the thickness T3 of the first conductive post 240 unlike the illustration, the second surface 212 of the first semiconductor die 210 may also be exposed. For example, the second surface 252 of the first sub molding layer 250 may be located at the same level as the second surface 212 of the first semiconductor die 210.

The first sub molding layer 250 may be formed through a process of forming a molding material, for example, epoxy molding compound (EMC) on the first redistribution layer 230 so as to have a thickness that sufficiently covers the first semiconductor die 210, the first bridge die 220, and the first conductive posts 240, and then performing a grinding process to expose the other ends of the first conductive posts 240. The grinding process may include a mechanical or chemical polishing process. Thus, the second surface 252 of the first sub molding layer 250 and the other ends of the first conductive posts 240 may form a flat surface.

The first sub connection terminals 260 may be connected to parts of the first redistribution conductive layer 232 through openings of the second redistribution dielectric layer 233. The first sub connection terminals 260 may include solder balls or solder bumps, for example. The first sub connection terminals 260 may be disposed in an area overlapping the first bridge die 220. Furthermore, the first sub connection terminals 260 may be disposed at positions overlapping the respective first through vias 225. Thus, the first sub connection terminals 260 may also be arranged in a matrix shape at positions overlapping the respective first bridge die pads 226 illustrated in FIG. 3.

One side of the above-described first sub package 200, for example, the top side, may be electrically coupled to another component, for example, another semiconductor package or external device through the first conductive posts 240 on the first bridge die 220, and the other side of the first sub package 200, for example, the bottom side, may be electrically coupled to another component, for example, another semiconductor package or external device through the first sub connection terminals 260 under the first bridge die 220. In other words, the first semiconductor die 210 in the first sub package 200 may be connected to outside components through the first bridge die 220.

Because the second and third sub packages 300 and 400 have substantially the same configuration as the first sub package 200, the detailed descriptions thereof are omitted herein. In addition, because the fourth sub package 500 has substantially the same configuration as the first sub package 200 except the arrangement of fourth conductive posts 540, the detailed descriptions of the same configuration are omitted herein.

Referring back to FIG. 1, the first bridge die 220 of the first sub package 200 may be connected to the base substrate 100 through the first redistribution layer 230 and the first sub connection terminals 260, and connected to a second bridge die 320 of the second sub package 300 through the first conductive posts 240.

The second sub package 300 may include a second semiconductor die 310, a second bridge die 320, a second redistribution layer 330, second conductive posts 340, a second sub molding layer 350, and second sub connection terminals 360. The second bridge die 320 of the second sub package 300 may be connected to the first bridge die 220 of the first sub package 200 through a second redistribution layer 330 and second sub connection terminals 360, and connected to a third bridge die 420 of the third sub package 400 through second conductive posts 340.

The third sub package 400 may include a third semiconductor die 410, a third bridge die 420, a third redistribution layer 430, third conductive posts 440, a third sub molding layer 450, and third sub connection terminals 460. The third bridge die 420 of the third sub package 400 may be connected to the second bridge die 320 of the second sub package 300 through a third redistribution layer 430 and third sub connection terminals 460, and connected to a fourth bridge die 520 of the fourth sub package 500 through third conductive posts 440.

The fourth sub package 500 may include a fourth semiconductor die 510, a fourth bridge die 520, a fourth redistribution layer 530, fourth conductive posts 540, a fourth sub molding layer 450, and fourth sub connection terminals 560. The fourth bridge die 520 of the fourth sub package 500 may be connected to the third bridge die 420 of the third sub package 400 through a fourth redistribution layer 530 and fourth sub connection terminals 560, and connected to the shielding layer 700 through the fourth conductive posts 540.

Because the first, second, and third conductive posts 240, 340, and 440 have a relatively large diameter or plan area as described above, the first to third conductive posts 240, 340, and 440 may be readily and directly attached to the corresponding second, third, and fourth sub connection terminals 360, 460, and 560. Furthermore, because the fourth conductive posts 540 have a relatively large diameter or plan area, the fourth conductive posts 540 may be readily and directly attached to the shielding layer 700. As a result, the components can be readily connected to each other, and the contact resistance therebetween can be reduced. In particular, the fourth conductive posts 540 and the shielding layer 700 can be readily connected, and the contact resistance therebetween can be reduced.

Through the connection structure between the first, second, third, and fourth bridge dies 220, 320, 420, and 520 and the first, second, third, and fourth conductive posts 240, 340, 440, and 540, a signal may be transferred, a voltage may be provided, or a ground may be provided separately from the provided voltage. In FIG. 1, a signal transfer path is represented by S, a voltage providing path is represented by V, and a ground providing path is represented by G. Hereafter, referring to FIGS. 1, 3, and 4 together, the structure is described in more detail.

Referring to FIGS. 1, 3, and 4, the first conductive posts 240 on the first bridge die 220 may include voltage-providing first conductive posts 240V, signal-transfer first conductive posts 240S, and ground-providing first conductive posts 240G. The voltage-providing first conductive posts 240V may be connected to the first bridge voltage pads 226V (see FIG. 3) through the first through vias 225, respectively, and arranged in a line to overlap the column C1 of the first bridge voltage pads. The signal-transfer first conductive posts 240S may be connected to the first bridge signal pads 226S (see FIG. 3) through the first through vias 225, respectively, and arranged in a line to overlap the column C2 of the first bridge signal pads. The ground-providing first conductive posts 240G may be connected to the first ground pads 226G (see FIG. 3) through the first through vias 225, respectively, and arranged in a line to overlap the column C3 of the first ground pads.

Thus, the voltage providing path V may be formed from the first semiconductor die 210 toward one side of the first sub package 200, for example, the top side through the first bridge die 220 and the voltage-providing first conductive posts 240V. Furthermore, the signal transfer path S may be formed from the first semiconductor die 210 toward the one side of the first sub package 200, for example, the top side through the first bridge die 220 and the signal-transfer first conductive posts 240S. Furthermore, the ground providing path G may be formed toward the one side of the first sub package 200, for example, the top side through the first bridge die 220 and the ground-providing first conductive posts 240G, but not be connected to the first semiconductor die 210. The voltage providing path V, the signal transfer path S, and the ground providing path G may be electrically isolated from one another. Because the first conductive posts 240 have a relatively large diameter as described above, the resistances of the voltage providing path V, the signal transfer path S, and the ground providing path G may be reduced, and the voltage providing path V, the signal transfer path S, and the ground providing path G may be readily connected to a component disposed over the first sub package 200, for example, the second sub package 300.

The second conductive posts 340 on the second bridge die 320 may have the same arrangement as the first conductive posts 240 while overlapping the first conductive posts 240. That is, the second conductive posts 340 may include voltage-providing second conductive posts 340V, signal-transfer second conductive posts 340S, and ground-providing second conductive posts 340G. The voltage-providing second conductive posts 340V may be arranged to overlap the voltage-providing first conductive posts 240V, the signal-transfer second conductive posts 340S may be arranged to overlap the signal-transfer first conductive posts 240S, and the ground-providing second conductive posts 340G may be arranged to overlap the ground-providing first conductive posts 240G.

The third conductive posts 440 on the third bridge die 420 may also include voltage-providing third conductive posts 440V, signal-transfer third conductive posts 440S and ground-providing third conductive posts 440G. Because the third bridge die 420 and the third conductive posts 440 are disposed/arranged in the same manner as the second bridge die 320 and the second conductive posts 340, the third bridge die 420 and the third conductive posts 440 are illustrated like the same components as the second bridge die 320 and the second conductive posts 340 in FIG. 4.

Therefore, the voltage providing path V may be extended vertically to the voltage-providing third conductive posts 440V through the voltage-providing second conductive posts 340V, the signal transfer path S may be extended vertically to the signal-transfer third conductive posts 440S through the signal-transfer second conductive posts 340S, and the ground providing path G may be extended vertically to the ground-providing third conductive posts 440G through the ground-providing second conductive posts 340G.

The fourth conductive posts 540 on the fourth bridge die 520 may include ground-providing fourth conductive posts 540G arranged in a line to overlap the column C3 of the first ground pads. Thus, the ground providing path G may be extended vertically to the ground-providing fourth conductive posts 540G. On the other hand, the fourth conductive posts 540 might not overlap the first and second columns C1 and C2. Thus, the voltage providing path V and the signal transfer path S may be extended only to fourth through vias 525 of the fourth bridge die 520.

Referring back to FIG. 1, the molding layer 600 may be formed to expose the upper ends of the fourth conductive posts 540 while covering the first to fourth sub packages 200, 300, 400, and 500 stacked over the base substrate 100.

For example, when the upper ends of the fourth conductive posts 540 are located at the same level as a second surface 552 of a fourth sub molding layer 550, the molding layer 600 may also have a surface located at the same level as the second surface 552. Furthermore, the molding layer 600 may be formed enough to fill spaces between the first to fourth sub packages 200, 300, 400, and 500 while covering the side surfaces of the first to fourth sub packages 200, 300, 400, and 500.

The molding layer 600 may be formed through a process of forming a molding material, for example, EMC on the base substrate 100 so as to sufficiently cover the first to fourth sub packages 200, 300, 400, and 500, and then performing a grinding process to expose the upper ends of the fourth conductive posts 540.

The shielding layer 700 may be disposed on the molding layer 600 and contacted with the fourth conductive posts 540. For example, the shielding layer 700 may have a shape that is extended to the side surface of the base substrate 100 while covering the entire surface of the molding layer 600. However, the present embodiment is not limited thereto, and the shape of the shielding layer 700 may be different in different embodiments as long as the shielding layer 700 is disposed on the molding layer 600 and contacts the fourth conductive posts 540. The shielding layer 700 may include one or more metals.

The external connection terminals 800 may be disposed on the second surface 102 of the base substrate 100 and serve to connect the semiconductor package 1000 to an external component (not illustrated), such as a module substrate.

The above-described semiconductor package 1000 in accordance with some embodiments may provide the following advantages.

First, because the stack package in which the plurality of packages are stacked through the bridge dies can be provided, it is possible to achieve high integration of the semiconductor package.

Furthermore, the conductive posts connected to the ground among the conductive posts connected to the bridge dies may be extended to the surface of the molding layer and connected to the shielding layer. Thus, the shielding layer and the semiconductor package can be readily connected to each other, and the contact resistance therebetween can be reduced.

In the above-described embodiment, the case in which the ground providing path for providing the ground to the shielding layer is formed separately from the voltage providing path between the semiconductor die and the bridge die has been described. However, a part of the voltage providing path between the semiconductor die and the bridge die can be used as the ground providing path for providing the ground to the shielding layer. For example, when some of the first bridge voltage pads 226V of FIG. 3 are pads connected to the ground, the fourth conductive posts 540 may be further formed on the connection structure of the first, second, third, and fourth through vias 225, 325, 425, and 525 overlapping the some of the first bridge voltage pads 226V, and connected to the shielding layer 700. In this case, a ground providing path separate from the voltage providing path between the semiconductor die and the bridge die may be omitted. This structure is illustrated in FIG. 5.

Figure 5:
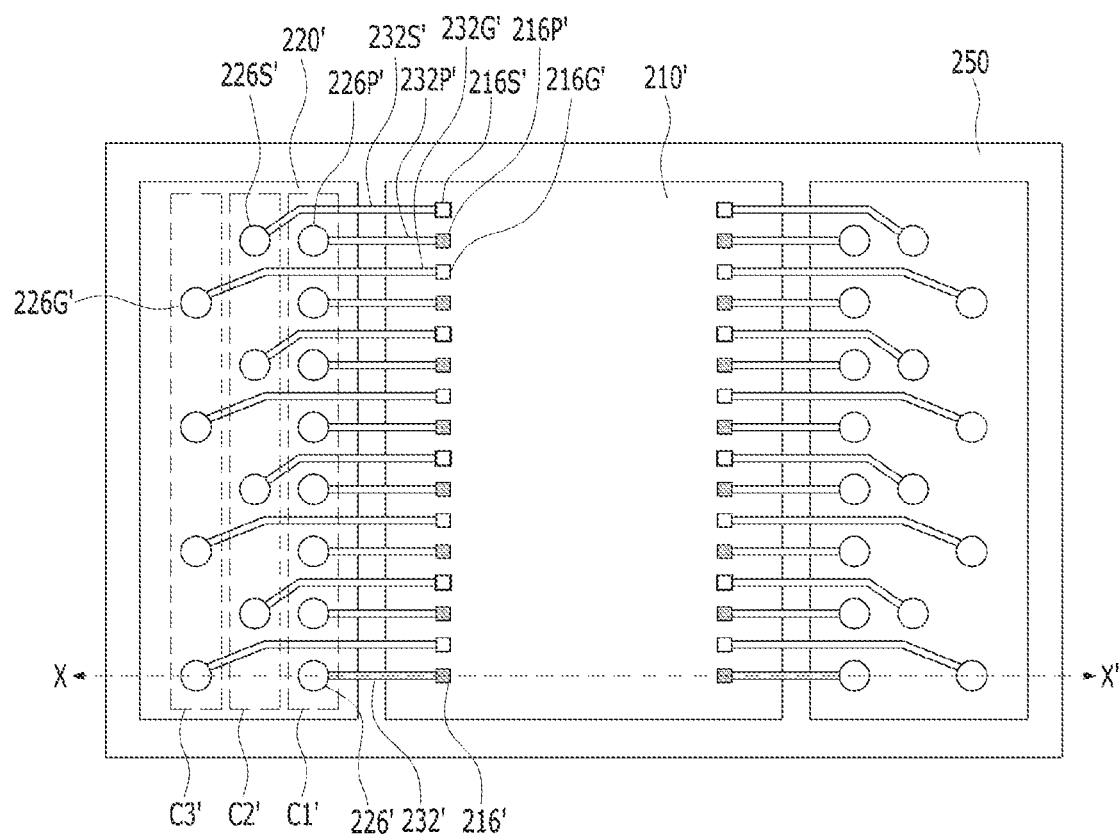
FIG. 5 is a plan view illustrating a surface of a semiconductor package in accordance with an embodiment.

FIG. 5 is a diagram illustrating a semiconductor package in accordance with an embodiment. In particular, FIG. 5 is a plan view corresponding to FIG. 3. The following descriptions are focused on differences from FIG. 3.

Referring to FIG. 5, a plurality of first die pads 216' may include first signal pads 216S' to which an input/output signal is applied, first power pads 216P' connected to a power supply, and first ground pad 216G' connected to a ground.

A plurality of first bridge die pads 226' may include first bridge signal pads 226S' to be connected to the first signal pads 216S', first bridge power pads 226P' to be connected to the first power pads 216P', and first bridge ground pads 226G' to be connected to the first ground pads 216G'. In the present embodiment, the first bridge power pads 226P' may be arranged in a line so as to be located the closest to the first semiconductor die 210' (see C1'), the first bridge ground pads 226G' may be arranged in a line so as to be located the farthest from the first semiconductor die 210' (see C3'), and the first bridge signal pads 226S' may be disposed in a line between the column C1' of the first bridge power pads 226P' and the column C3' of the first bridge ground pads 226G' (see C2').

A plurality of first redistribution conductive layers 232' may include first signal redistribution conductive layers 232S' connecting the first signal pads 216S' to the first bridge signal pads 226S', first power redistribution conductive layers 232P' connecting the first power pads 216P' to the first bridge power pads 226P', and first ground redistribution conductive layers 232G' connecting the first ground pads 216G' to the first bridge ground pads 226G'. For such connections, the first redistribution conductive layers 232' may have a straight line, curved shape, or angled shape.

In accordance with the present embodiment, a ground providing path may be formed from the first ground pad 216G' of the first semiconductor die 210' to the uppermost conductive post (not illustrated) through the first bridge ground pad 226G'.

Figure 6:
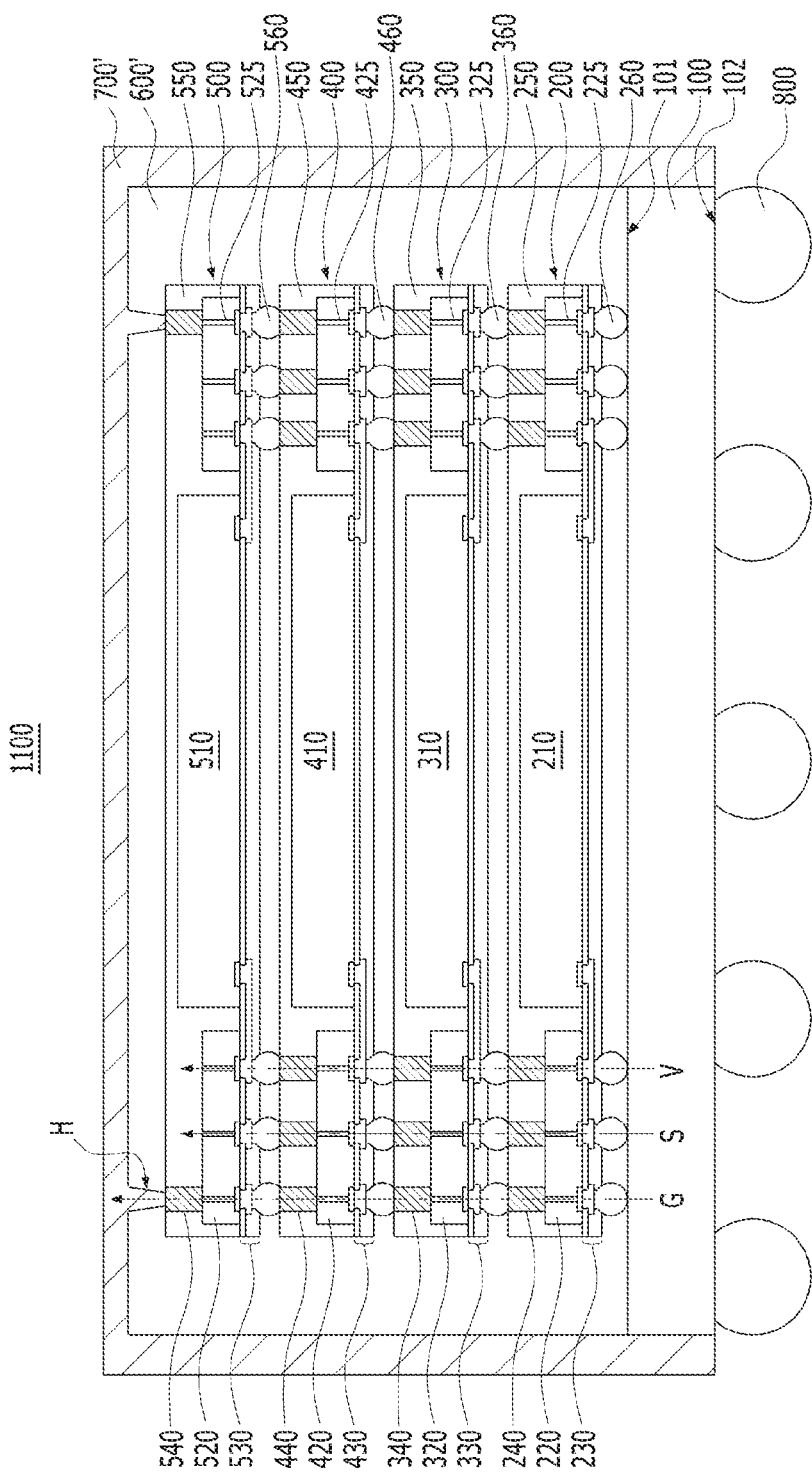
FIG. 6 is a view illustrating a semiconductor package in accordance with an embodiment.

FIG. 6 is a diagram illustrating a semiconductor package in accordance with an embodiment. In particular, FIG. 6 is a cross-sectional view corresponding to FIG. 1. The same components as those of FIG. 1 are represented by like reference numerals, and the detailed descriptions thereof are omitted herein.

Referring to FIG. 6, a molding layer 600' in the semiconductor package 1100 in accordance with an embodiment may be formed to cover the top surfaces of the first to fourth sub packages 200, 300, 400, and 500 stacked over the base substrate 100 as well as the side surfaces thereof, thereby having a thickness that does not expose the upper ends of the fourth conductive posts 540.

However, the molding layer 600' may have holes H formed to overlap the respective fourth conductive posts 540, such that the upper ends of the fourth conductive posts 540 are exposed through the holes H.

A shielding layer 700' may be formed on the molding layer 600' and connected to the fourth conductive posts 540 through the holes H. For this structure, a conductive layer for forming the shielding layer 700' may fill the holes H.

In this case, although not illustrated, the first to fourth sub packages 200, 300, 400, and 500 may have the same structure. That is, the fourth conductive posts 540 may be arranged in the same manner as the first to third conductive posts 240, 340, and 440. However, the holes H may be formed to expose the fourth conductive posts 540 connected to the ground.

Figure 7:
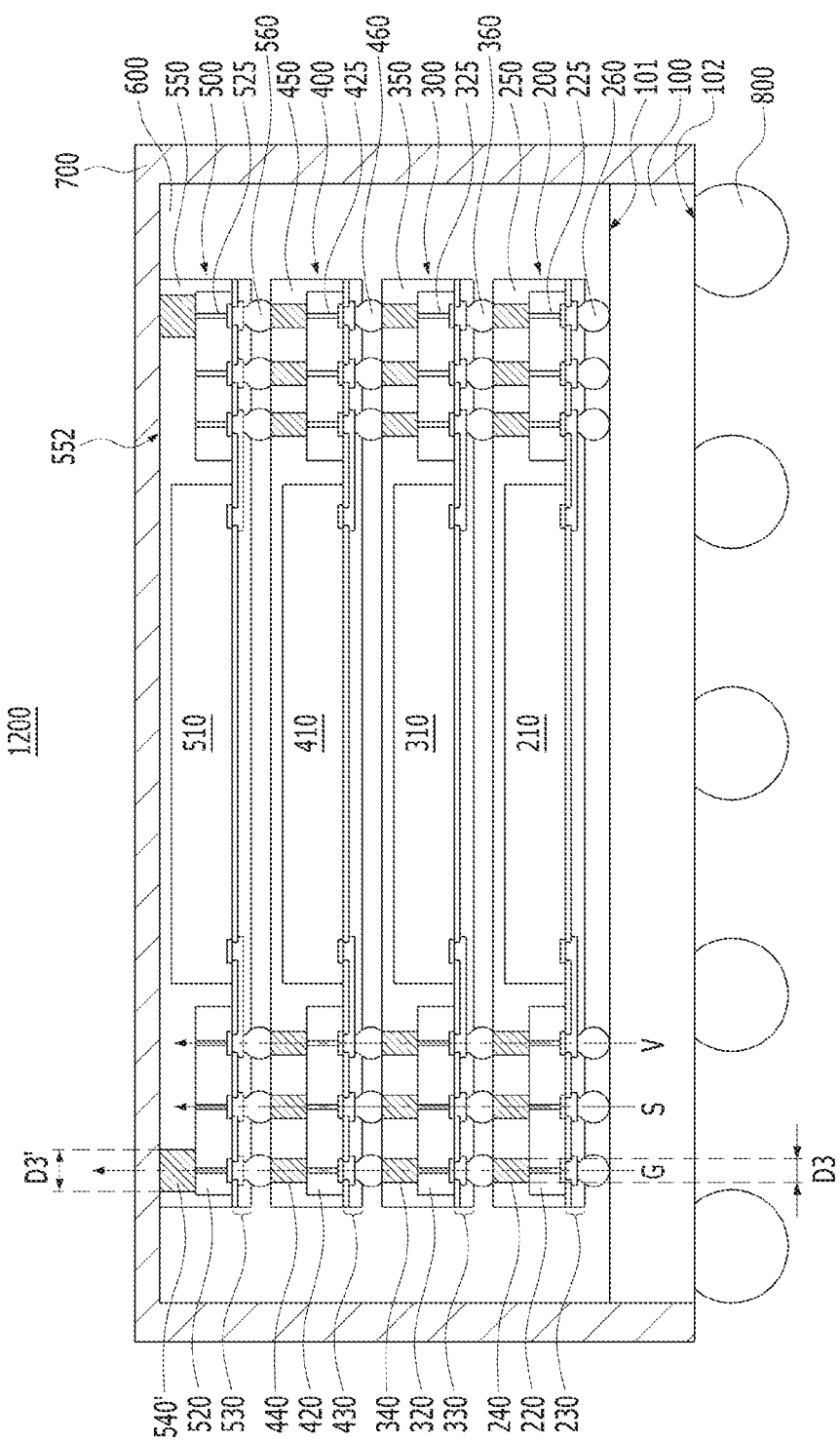
FIG. 7 is a view illustrating a semiconductor package in accordance with an embodiment.

FIG. 7 is a diagram illustrating a semiconductor package in accordance with an embodiment. In particular, FIG. 7 is a cross-sectional view corresponding to FIG. 1. The same components as those of FIG. 1 are represented by like reference numerals, and the detailed descriptions thereof are omitted herein.

Referring to FIG. 7, the first to third conductive posts 240, 340, and 440 included in the first to third sub packages 200, 300, and 400 in the semiconductor package 1200 may have the same plan area and/or diameter D3.

However, fourth conductive posts 540' included in the uppermost fourth sub package 500 may have a larger plan area and/or diameter D3' than the plan area and/or diameter D3 of the first to third conductive posts 240, 340, and 440.

In accordance with the present embodiment, the contact areas between the fourth conductive posts 540' and the shielding layer 700 may be further increased. Therefore, contact resistance between the fourth conductive posts 540' and the shielding layer 700 can be further reduced.

In accordance with the present embodiments, it is possible to provide a semiconductor package which can provide a stack package having a plurality of packages stacked therein in order to achieve high integration, and reduce contact resistance while the stack package and an electromagnetic interference shielding layer are connected.

Figure 8:
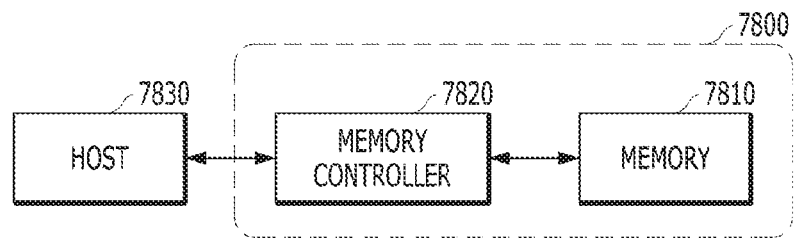
FIG. 8 shows a block diagram illustrating an electronic system employing a memory card including a semiconductor package, according to an embodiment.

FIG. 8 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 9:
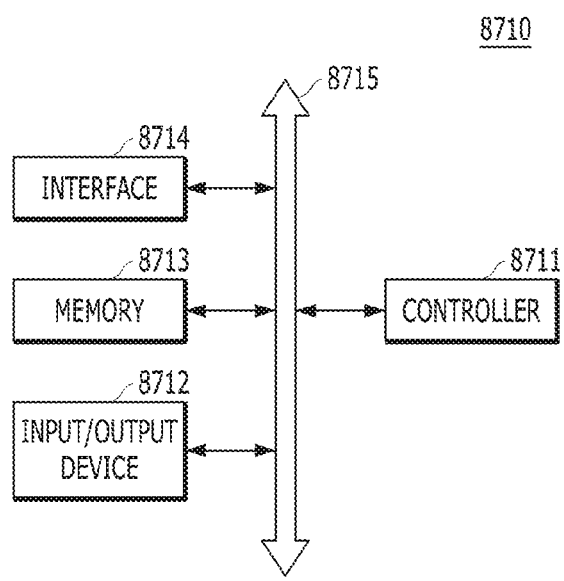
FIG. 9 shows a block diagram illustrating another electronic system including a semiconductor package, according to an embodiment.

FIG. 9 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Although various embodiments have been described for illustrative purposes, it will be apparent to those skilled in the art that various changes and modifications may be made without departing from the spirit and scope of the invention as defined in the following claims.

What is claimed is:

1. A semiconductor package comprising:
   a base substrate;
   first to $N^{th}$ sub packages sequentially stacked over the base substrate, wherein each of the N sub packages comprises a semiconductor die and a bridge die disposed on at least one side of the semiconductor die and electrically connected to the semiconductor die, where N is a natural number equal to or more than two (2);
   a molding layer formed on the base substrate, wherein the molding layer covers the first to $N^{th}$ sub packages and leaves an $N^{th}$ conductive post included in the $N^{th}$ sub package exposed; and
   a shielding layer formed on the molding layer, wherein the shielding layer is electrically connected to the exposed $N^{th}$ conductive post,
   wherein the first to $(N-1)^{th}$ sub packages further comprise first to $(N-1)^{th}$ pluralities of conductive posts disposed on the first to $(N-1)^{th}$ bridge dies of the first to $(N-1)^{th}$ sub packages, respectively, wherein the first to $(N-1)^{th}$ pluralities of conductive posts electrically connect each of the first to $(N-1)^{th}$ bridge dies, respectively, to the bridge die of the sub package disposed thereon among the second to $N^{th}$ sub packages,
   wherein the $N^{th}$ conductive post of the $N^{th}$ sub package electrically connects the $N^{th}$ bridge die with the shielding layer and electrically connects with conductive posts among the first to $(N-1)^{th}$ pluralities of conductive posts to provide a ground providing path through the first to $N^{th}$ bridge dies of the first to $N^{th}$ sub packages.

2. The semiconductor package of claim 1, wherein:
   conductive posts among the first to $(N-1)^{th}$ pluralities of conductive posts are electrically connected to provide a signal transfer path through the first to $(N-1)^{th}$ bridge dies of the first to $(N-1)^{th}$ sub packages to the $N^{th}$ bridge die of the $N^{th}$ sub package;
   conductive posts among the first to $(N-1)^{th}$ pluralities of conductive posts are electrically connected to provide a power providing path through the first to $(N-1)^{th}$ bridge dies of the first to $(N-1)^{th}$ sub packages to the $N^{th}$ bridge die of the $N^{th}$ sub package; and
   the $N^{th}$ conductive post is electrically isolated from the signal transfer path and the power providing path.

3. The semiconductor package of claim 2, wherein:
   the signal transfer path and the power providing path are electrically coupled to the first to $N^{th}$ semiconductor dies, and
   the ground providing path is electrically isolated from the first to $N^{th}$ semiconductor dies.

4. The semiconductor package of claim 2, wherein the signal transfer path, the power providing path, and the ground providing path are electrically coupled to the first to $N^{th}$ semiconductor dies.

5. The semiconductor package of claim 1, wherein for every natural number M equal to or greater than one (1) and less than or equal to N, a thickness of the $M^{th}$ bridge die is less than a thickness of the $M^{th}$ semiconductor die.

6. The semiconductor package of claim 5, wherein:
   for every natural number M equal to or greater than one (1) and less than or equal to N-1, a sum of the thickness of the $M^{th}$ bridge die and a thickness of the $M^{th}$ plurality of conductive posts is equal to or greater than the thickness of the $M^{th}$ semiconductor die; and
   a sum of the thickness of the $N^{th}$ bridge die and a thickness of the $N^{th}$ conductive post is equal to or greater than a thickness of the $N^{th}$ semiconductor die.

7. The semiconductor package of claim 1, wherein a surface of the molding layer is located at a same level as an exposed surface of the exposed $N^{th}$ conductive post.

8. The semiconductor package of claim 7, wherein the surface of the molding layer is located at the same level as a surface of the $N^{th}$ semiconductor die of the $N^{th}$ sub package.

9. The semiconductor package of claim 1, wherein the surface of the molding layer is located above an exposed surface of the $N^{th}$ conductive post, and
   the molding layer further comprises a hole that exposes the $N^{th}$ conductive post.

10. The semiconductor package of claim 9, wherein the shielding layer fills the hole.

11. The semiconductor package of claim 1, wherein a plan area of the $N^{th}$ conductive post is equal to or greater than a plan area of each conductive post of the first to $(N-1)^{th}$ pluralities of conductive posts.

12. The semiconductor package of claim 1, wherein:
   for every natural number M equal to or greater than one (1) and less than or equal to N-1, the $M^{th}$ bridge die comprises an $M^{th}$ plurality of through vias connected to the $M^{th}$ plurality of conductive posts, respectively; and
   the $N^{th}$ bridge die comprises an $N^{th}$ through via connected to the $N^{th}$ conductive post.

13. The semiconductor package of claim 12, wherein:
   for every natural number M equal to or greater than one (1) and less than or equal to N-1, each through via of the $M^{th}$ plurality of through vias has a plan area smaller than a plan area of each conductive post of the $M^{th}$ plurality of conductive posts; and
   a plan area of the $N^{th}$ through via is less than a plan area of the $N^{th}$ conductive post.

14. A semiconductor package comprising:
   a base substrate;
   first to $N^{th}$ sub packages sequentially stacked over the base substrate, wherein each of the N sub packages comprises a semiconductor die and a bridge die disposed on at least one side of the semiconductor die and electrically coupled to the semiconductor die through a redistribution layer, where N is a natural number equal to or more than two (2);

a molding layer formed on the base substrate, wherein the molding layer covers the first to $N^{th}$ sub packages and leaves an $N^{th}$ conductive post included in the $N^{th}$ sub package exposed; and a shielding layer formed on the molding layer, wherein the shielding layer is electrically connected to the exposed $N^{th}$ conductive post, wherein each of the first to $(N-1)^{th}$ sub packages further comprise first to $(N-1)^{th}$ pluralities of conductive posts disposed on the first to $(N-1)^{th}$ bridge dies of the first to $(N-1)^{th}$ sub packages, respectively, wherein the first to $(N-1)^{th}$ pluralities of conductive posts electrically connect each of the first to $(N-1)^{th}$ bridge dies, respectively, to the bridge die of the sub package disposed thereon among the second to $N^{th}$ sub packages, wherein the $N^{th}$ conductive post of the $N^{th}$ sub package electrically connects the $N^{th}$ bridge die to the shielding layer and electrically connects with conductive posts among the first to $(N-1)^{th}$ pluralities of conductive posts to provide a ground providing path through the first to $N^{th}$ bridge dies of the first to $N^{th}$ sub packages.

15. The semiconductor package of claim 14, wherein:
each of the first to $N^{th}$ semiconductor dies comprises a signal pad to which an input/output signal is applied, a power pad to which power is applied, and a ground pad to which a ground is applied;

each of the first to $N^{th}$ bridge dies comprises a bridge signal pad connected to the signal pad, a bridge power pad connected to the power pad, a bridge ground pad connected to the ground pad, and an additional bridge ground pad which is not connected to the signal pad, the power pad, or the ground pad; and each of the first to $N^{th}$ redistribution layers comprises a signal redistribution conductive layer connecting the signal pad to the bridge signal pad, a power redistribution conductive layer connecting the power pad to the bridge power pad, and a ground redistribution conductive layer connecting the ground pad to the bridge ground pad.

16. The semiconductor package of claim 15, wherein the $N^{th}$ conductive post and the conductive posts located on the ground providing path are electrically coupled to the additional bridge ground pad while overlapping the additional bridge ground pad.

17. The semiconductor package of claim 16, wherein other conductive posts except the conductive posts located on the ground providing path among the conductive posts of the first to $(N-1)^{th}$ pluralities of conductive posts are electrically coupled to the bridge signal pad, the bridge power pad, or the bridge ground pad while overlapping the bridge signal pad, the bridge power pad, or the bridge ground pad, respectively, wherein the $N^{th}$ conductive post does not overlap the other conductive posts.

18. The semiconductor package of claim 14, wherein:
each of the first to $N^{th}$ semiconductor dies comprises a signal pad to which an input/output signal is applied, a power pad to which power is applied, and a ground pad to which a ground is applied, each of the first to $N^{th}$ bridge dies comprises a bridge signal pad connected to the signal pad, a bridge power pad connected to the power pad, and a bridge ground pad connected to the ground pad, and each of the first to $N^{th}$ redistribution layers comprises a signal redistribution conductive layer connecting the signal pad to the bridge signal pad, a power redistribution conductive layer connecting the power pad to the bridge power pad, and a ground redistribution conductive layer connecting the ground pad to the bridge ground pad.

19. The semiconductor package of claim 18, wherein the $N^{th}$ conductive post and the conductive posts located on the ground providing path are electrically coupled to the bridge ground pads while overlapping with the bridge ground pads.

20. The semiconductor package of claim 19, wherein other conductive posts except the conductive post positioned on the ground providing path among the conductive posts of the first to $(N-1)^{th}$ pluralities of conductive posts are electrically coupled to the bridge signal pad or the bridge power pad while overlapping the bridge signal pad or the bridge power pad, respectively, wherein the $N^{th}$ conductive post does not overlap the other conductive posts.

21. The semiconductor package of claim 14, wherein for each of the first to $N^{th}$ sub packages, the bridge die and the semiconductor die are disposed on a first surface of the redistribution layer, wherein each of the first to $N^{th}$ sub packages further comprises a sub molding layer formed on the first surface of the redistribution layer and exposing each of the plurality of conductive posts or the $N^{th}$ conductive post while covering the bridge die and the semiconductor die.

22. The semiconductor package of claim 21, wherein each of the first to $N^{th}$ sub packages further comprises a sub connection terminal formed on a second surface of the redistribution layer opposite to the first surface of the redistribution layer, wherein the sub connection terminal is electrically coupled to the redistribution layer, wherein the sub connection terminal of any one sub package of the first to $N^{th}$ sub packages is contacted with the conductive post of another sub package adjacent to the any one sub package of the first to $N^{th}$ sub packages.

* * * * *